United States Patent
Pan

(10) Patent No.: US 10,411,100 B2
(45) Date of Patent: Sep. 10, 2019

(54) SEMICONDUCTOR STRUCTURE AND MANUFACTURING METHOD THEREOF

(71) Applicant: United Microelectronics Corp., Hsinchu (TW)

(72) Inventor: Chen-Wei Pan, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/645,844

(22) Filed: Jul. 10, 2017

(65) Prior Publication Data

US 2018/0374922 A1 Dec. 27, 2018

(30) Foreign Application Priority Data

Jun. 22, 2017 (CN) .......................... 2017 1 0479670

(51) Int. Cl.
| | |
|---|---|
| *H01L 21/02* | (2006.01) |
| *H01L 29/36* | (2006.01) |
| *H01L 21/225* | (2006.01) |
| *H01L 21/265* | (2006.01) |
| *H01L 21/28* | (2006.01) |
| *H01L 29/49* | (2006.01) |
| *H01L 29/78* | (2006.01) |
| *H01L 29/08* | (2006.01) |

(52) U.S. Cl.
CPC ........ *H01L 29/365* (2013.01); *H01L 21/2253* (2013.01); *H01L 21/26533* (2013.01); *H01L 21/28035* (2013.01); *H01L 29/4916* (2013.01); *H01L 29/78* (2013.01); *H01L 29/0843* (2013.01)

(58) Field of Classification Search
CPC ............... H01L 29/365; H01L 29/4916; H01L 21/2253; H01L 21/26533; H01L 21/28035; H01L 29/0843
See application file for complete search history.

(56) References Cited

U.S. PATENT DOCUMENTS

| | | | | |
|---|---|---|---|---|
| 5,364,803 | A | * | 11/1994 | Lur ................... H01L 21/28061 257/E21.2 |
| 6,191,463 | B1 | * | 2/2001 | Mitani .............. H01L 21/28176 257/410 |
| 6,764,898 | B1 | | 7/2004 | En et al. |
| 7,867,839 | B2 | | 1/2011 | Chen et al. |
| 8,076,228 | B2 | | 12/2011 | Berthold et al. |
| 9,508,827 | B2 | | 11/2016 | Ke et al. |
| 2015/0162391 | A1 | | 6/2015 | Kim |

* cited by examiner

*Primary Examiner* — Stephen M Bradley
*Assistant Examiner* — Wasiul Haider
(74) *Attorney, Agent, or Firm* — J.C. Patents

(57) ABSTRACT

A semiconductor structure including a substrate, a dielectric layer and a polysilicon layer is provided. The dielectric layer is disposed on the substrate. The polysilicon layer is disposed on the dielectric layer. A fluorine dopant concentration in the polysilicon layer presents Gaussian distributions from a top portion to a bottom portion of the polysilicon layer. Fluorine dopant peak concentrations of the Gaussian distributions are progressively decreased from the top portion to the bottom portion of the polysilicon layer.

6 Claims, 1 Drawing Sheet

SEMICONDUCTOR STRUCTURE AND MANUFACTURING METHOD THEREOF

CROSS REFERENCE TO RELATED APPLICATION

This application claims the priority benefits of China application serial no. 201710479670.X, filed on Jun. 22, 2017. The entirety of the above-mentioned patent application is hereby incorporated by reference herein and made a part of specification.

BACKGROUND OF THE INVENTION

Field of the Invention

The invention relates to a semiconductor structure and a manufacturing method thereof, and particularly relates to a semiconductor structure capable effectively mitigating flicker noise and a manufacturing method thereof.

Description of Related Art

In a semiconductor device, when a dielectric layer has excessive oxide traps, flicker noise is increased to decrease a performance of the semiconductor device.

At present, the industry often uses fluorine dopant to fill the oxide traps, so as to decrease the flicker noise. However, the above solution may only fill the oxide traps located at an interface of the dielectric layer and a substrate, so that only the flicker noise of a high frequency portion is mitigated, and the flicker noise of other frequency (for example, a low frequency) portion cannot be mitigated.

SUMMARY OF THE INVENTION

The invention is directed to a semiconductor structure and a manufacturing method thereof, which are adapted to mitigate flicker noise of both of a high frequency portion and a low frequency portion.

The invention provides a semiconductor structure including a substrate, a dielectric layer and a polysilicon layer. The dielectric layer is disposed on the substrate. The polysilicon layer is disposed on the dielectric layer. A fluorine dopant concentration in the polysilicon layer presents Gaussian distributions from a top portion to a bottom portion of the polysilicon layer. Fluorine dopant peak concentrations of the Gaussian distributions are progressively decreased from the top portion to the bottom portion of the polysilicon layer.

In an embodiment of the invention, in the aforementioned semiconductor structure, the substrate is, for example, a silicon substrate.

In an embodiment of the invention, in the aforementioned semiconductor structure, a material of the dielectric layer is, for example, silicon oxide.

In an embodiment of the invention, in the aforementioned semiconductor structure, a material of the polysilicon layer is, for example, doped polysilicon or undoped polysilicon.

In an embodiment of the invention, in the aforementioned semiconductor structure, the fluorine dopant peak concentrations include a first fluorine dopant peak concentration and a second fluorine dopant peak concentration. The first fluorine dopant peak concentration is close to the bottom portion of the polysilicon layer. The second fluorine dopant peak concentration is close to the top portion of the polysilicon layer.

In an embodiment of the invention, in the aforementioned semiconductor structure, the fluorine dopant peak concentrations further include a third fluorine dopant peak concentration. Compared to the second fluorine dopant peak concentration, the third fluorine dopant peak concentration is closer to the top portion of the polysilicon layer.

The invention provides a method for manufacturing a semiconductor structure, which includes following steps. A dielectric layer is formed on a substrate. A polysilicon layer is formed on the dielectric layer. Ion implantation processes are performed to the polysilicon layer by using a fluorine dopant. Implantation depths of the ion implantation processes are different. A fluorine dopant concentration of the ion implantation process with a deeper implantation depth is smaller than a fluorine dopant concentration of the ion implantation process with a shallower implantation depth. After the ion implantation processes, a thermal process is performed to the polysilicon layer.

According to an embodiment of the invention, in the aforementioned method for manufacturing the semiconductor structure, a method of forming the dielectric layer is, for example, thermal oxidation or chemical vapor deposition.

According to an embodiment of the invention, in the aforementioned method for manufacturing the semiconductor structure, a method of foil ling the polysilicon layer is, for example, chemical vapor deposition.

According to an embodiment of the invention, in the aforementioned method for manufacturing the semiconductor structure, the polysilicon layer is, for example, an unpatterned polysilicon layer or a patterned polysilicon layer.

According to an embodiment of the invention, in the aforementioned method for manufacturing the semiconductor structure, the step of performing ion implantation processes to the polysilicon layer is, for example, performed before a lightly doped drain (LDD), a source region or a drain region is formed.

According to an embodiment of the invention, in the aforementioned method for manufacturing the semiconductor structure, a fluorine dopant concentration in the polysilicon layer may present Gaussian distributions from a top portion to a bottom portion of the polysilicon layer. Fluorine dopant peak concentrations of the Gaussian distributions are progressively decreased from the top portion to the bottom portion of the polysilicon layer.

According to an embodiment of the invention, in the aforementioned method for manufacturing the semiconductor structure, the fluorine dopant peak concentrations include a first fluorine dopant peak concentration and a second fluorine dopant peak concentration. The first fluorine dopant peak concentration is close to the bottom portion of the polysilicon layer. The second fluorine dopant peak concentration is close to the top portion of the polysilicon layer.

According to an embodiment of the invention, in the aforementioned method for manufacturing the semiconductor structure, the fluorine dopant peak concentrations further include a third fluorine dopant peak concentration. Compared to the second fluorine dopant peak concentration, the third fluorine dopant peak concentration is closer to the top portion of the polysilicon layer.

According to an embodiment of the invention, in the aforementioned method for manufacturing the semiconductor structure, after the thermal process, the fluorine dopant concentration in the polysilicon layer may still present the Gaussian distributions.

According to an embodiment of the invention, in the aforementioned method for manufacturing the semiconductor structure, implantation energy of the ion implantation process with the deeper implantation depth is, for example, greater than implantation energy of the ion implantation process with the shallower implantation depth.

According to an embodiment of the invention, in the aforementioned method for manufacturing the semiconductor structure, the ion implantation processes include following steps. A first ion implantation process and a second ion implantation process are performed to the polysilicon layer. A first fluorine dopant concentration of the first ion implantation process is smaller than a second fluorine dopant concentration of the second ion implantation process. First implantation energy of the first ion implantation process is greater than second implantation energy of the second ion implantation process.

According to an embodiment of the invention, in the aforementioned method for manufacturing the semiconductor structure, the ion implantation processes further include a following step. A third ion implantation process is performed to the polysilicon layer. The second fluorine dopant concentration of the second ion implantation process is smaller than a third fluorine dopant concentration of the third ion implantation process. The second implantation energy of the second ion implantation process is greater than third implantation energy of the third ion implantation process.

According to an embodiment of the invention, in the aforementioned method for manufacturing the semiconductor structure, the first ion implantation process, the second implantation process and the third ion implantation process may be sequentially performed.

According to an embodiment of the invention, in the aforementioned method for manufacturing the semiconductor structure, the first ion implantation process, the second implantation process and the third ion implantation process may not be sequentially performed.

According to the above description, in the semiconductor structure of the invention, since the fluorine dopant peak concentrations of the Gaussian distributions are progressively decreased from the top portion to the bottom portion of the polysilicon layer, a specific fluorine dopant concentration distribution is formed in the polysilicon layer. In this way, after the thermal process is performed to the polysilicon layer, the fluorine dopant in the polysilicon layer is diffused into the dielectric layer, so that the oxide traps in the whole dielectric layer may be filled by the fluorine dopant in the Gaussian distributions with different fluorine dopant peak concentrations, so as to mitigate the flicker noise of both of a high frequency portion and a low frequency portion.

Moreover, in the method for manufacturing the semiconductor structure of the invention, since the fluorine dopant concentration of the ion implantation process with the deeper implantation depth is smaller than the fluorine dopant concentration of the ion implantation process with the shallower implantation depth, a specific fluorine dopant concentration distribution is formed in the polysilicon layer. In this way, after the thermal process is performed to the polysilicon layer, since the fluorine dopant in the polysilicon layer is diffused into the dielectric layer, the oxide traps in the whole dielectric layer may be filled by using the fluorine dopant in the specific fluorine dopant concentration distribution, so as to mitigate the flicker noise of both of the high frequency portion and the low frequency portion.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
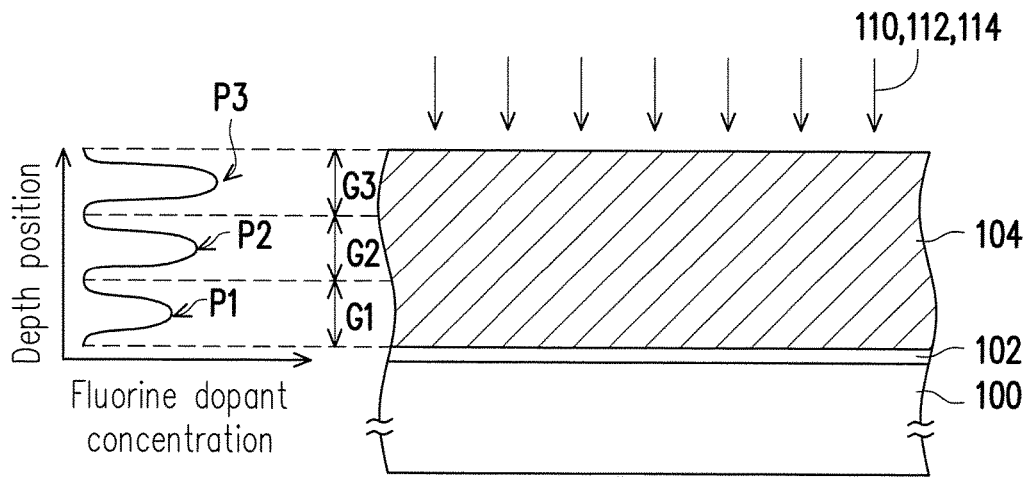
FIG. 1A to FIG. 1C are cross-sectional views of a process of manufacturing a semiconductor structure according to an embodiment of the invention.
Figure 1B:
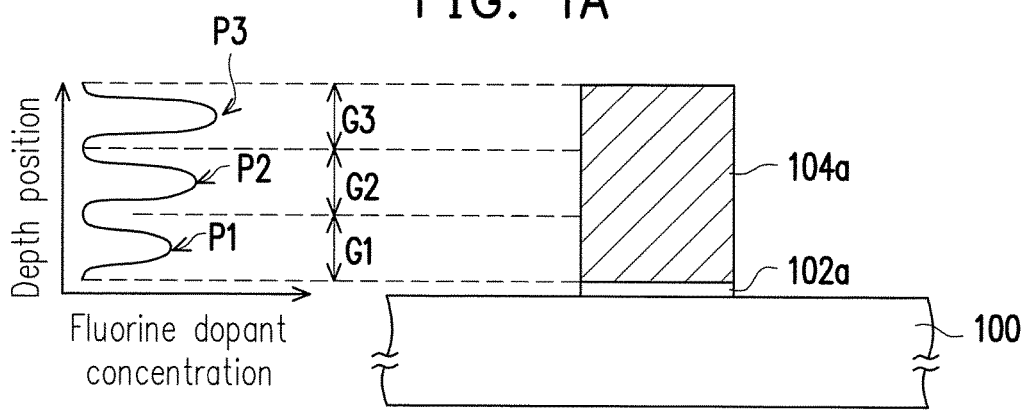
Figure 1C:
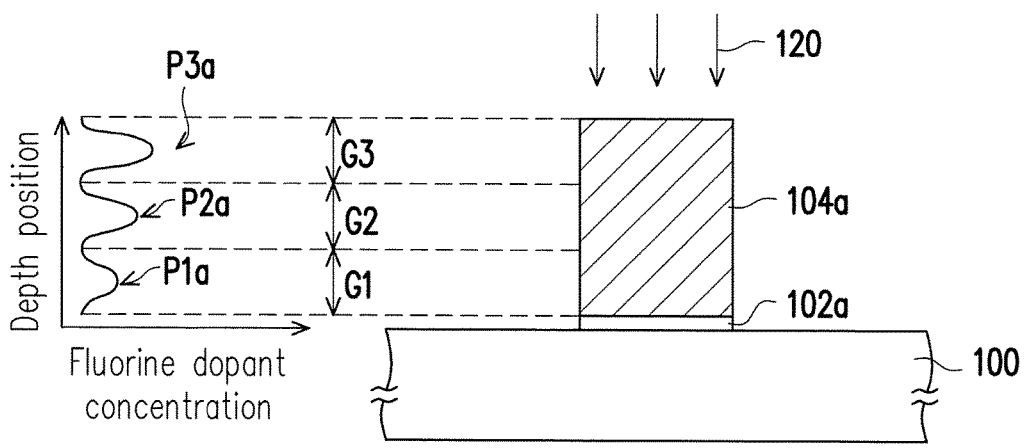

FIG. 1A to FIG. 1C are cross-sectional views of a process of manufacturing a semiconductor structure according to an embodiment of the invention. Moreover, in FIG. 1A to FIG. 1C, relationship curve diagrams of depth positions and fluorine dopant concentrations are also illustrated.

Referring to FIG. 1A, a dielectric layer 102 is formed on a substrate 100. The substrate 100 may be a semiconductor substrate, for example, a silicon substrate. A material of the dielectric layer 102 is, for example, oxide (for example, silicon oxide). A method for forming the dielectric layer 102 is, for example, thermal oxidation or chemical vapor deposition.

A polysilicon layer 104 is formed on the dielectric layer 102. A material of the polysilicon layer 104 is, for example, doped polysilicon or undoped polysilicon. A method for forming the polysilicon layer 104 is, for example, the chemical vapor deposition.

Ion implantation processes are performed to the polysilicon layer 104 by using a fluorine dopant, where implantation depths of the ion implantation processes are different. A fluorine dopant concentration of the ion implantation process with a deeper implantation depth is smaller than a fluorine dopant concentration of the ion implantation process with a shallower implantation depth. Implantation energy of the ion implantation process with the deeper implantation depth is, for example, greater than implantation energy of the ion implantation process with the shallower implantation depth. The ion implantation processes performed to the polysilicon layer is, for example, performed before a lightly doped drain (LDD), a source region or a drain region is formed.

In this way, the fluorine dopant concentration in the polysilicon layer 104 may present Gaussian distributions from a top portion to a bottom portion of the polysilicon layer 104. Fluorine dopant peak concentrations of the Gaussian distributions are progressively decreased from the top portion to the bottom portion of the polysilicon layer 104. The top portion of the polysilicon layer 104 is the portion of the polysilicon layer 104 located away from the dielectric layer 102. The bottom portion of the polysilicon layer 104 is the portion of the polysilicon layer 104 located close to the dielectric layer 102.

For example, the ion implantation processes performed to the polysilicon layer 104 by using the fluorine dopant may include a first ion implantation process 110 and a second ion implantation process 112 performed to the polysilicon layer 104, and may further include a third ion implantation process 114 performed to the polysilicon layer 104. In the present embodiment, the first ion implantation process 110, the second ion implantation process 112 and the third ion implantation process 114 are sequentially performed as an example. In another embodiment, the first ion implantation process 110, the second ion implantation process 112 and the third ion implantation process 114 may not be sequentially performed.

In the first ion implantation process 110, the second ion implantation process 112 and the third ion implantation process 114, the implantation depth of the first ion implantation process 110 is the deepest, the implantation depth of the second ion implantation process 112 is shallower, and the implantation depth of the third ion implantation process 114 is the shallowest. A first fluorine dopant concentration of the first ion implantation process 110 is smaller than a second fluorine dopant concentration of the second ion implantation process 112. The second fluorine dopant concentration of the second ion implantation process 112 is smaller than a third fluorine dopant concentration of the third ion implantation process 114. The first fluorine dopant concentration may be $1 \times 10^{15}$ ions/cm$^2$ to $4 \times 10^{15}$ ions/cm$^2$, for example, $3 \times 10^{15}$ ions/cm$^2$. The second fluorine dopant concentration may be $5 \times 10^{15}$ ions/cm$^2$ to $7 \times 10^{15}$ ions/cm$^2$, for example, $6 \times 10^{15}$ ions/cm$^2$. The third fluorine dopant concentration may be $8 \times 10^{15}$ ions/cm$^2$ to $1 \times 10^{16}$ ions/cm$^2$, for example, $8 \times 10^{15}$ ions/cm$^2$.

First implantation energy of the first ion implantation process 110 may be greater than second implantation energy of the second ion implantation process 112. The second implantation energy of the second ion implantation process 112 may be greater than third implantation energy of the third ion implantation process 114. The first implantation energy may be 27 KeV to 33 KeV, for example, 30 KeV. The second implantation energy may be 18 KeV to 22 KeV, for example, 20 KeV. The third implantation energy may be 9 KeV to 11 KeV, for example, 10 KeV.

Therefore, referring to a relationship curve diagram of the depth position and the fluorine dopant concentration of FIG. 1A, the fluorine dopant concentration in the polysilicon layer 104 may present a third Gaussian distribution G3, a second Gaussian distribution G2 and a first Gaussian distribution G1 from the top portion to the bottom portion of the polysilicon layer 104. The first Gaussian distribution G1, the second Gaussian distribution G2 and the third Gaussian distribution G3 respectively have a first fluorine dopant peak concentration P1, a second fluorine dopant peak concentration P2 and a third fluorine dopant peak concentration P3. The first fluorine dopant peak concentration P1 may be close to the bottom portion of the polysilicon layer 104. The second fluorine dopant peak concentration P2 may be close to the top portion of the polysilicon layer 104. Moreover, compared to the second fluorine dopant peak concentration P2, the third fluorine dopant peak concentration P3 may be closer to the top portion of the polysilicon layer 104. The second fluorine dopant peak concentration P2 may be greater than the first fluorine dopant peak concentration P1. The third fluorine dopant peak concentration P3 may be greater than the second fluorine dopant peak concentration P2.

Referring to FIG. 1B, a patterning process may be performed to the polysilicon layer 104 and the dielectric layer 102 to form patterned polysilicon layer 104a and dielectric layer 102a. The polysilicon layer 104a may serve as a gate. The dielectric layer 102a may serve as a gate dielectric layer. The patterning process is, for example, a combination of a lithography process and an etching process.

In the present embodiment, after the ion implantation processes are first performed to the unpatterned polysilicon layer 104, the polysilicon layer 104 is then patterned, though the invention is not limited thereto. In another embodiment, after the polysilicon layer 104 is first patterned, the ion implantation processes are then performed to the patterned polysilicon layer 104a.

Referring to a relationship curve diagram of depth positions and fluorine dopant concentrations of FIG. 1A and FIG. 1B, the fluorine dopant concentration distribution in the polysilicon layer 104a and the fluorine dopant concentration distribution of the polysilicon layer 104 are substantially the same.

Referring to FIG. 1C, after the ion implantation processes are performed, a thermal process 120 is performed to the polysilicon layer 104a. The thermal process 120 may be a subsequent thermal process used for forming the source region or the drain region or an additionally perform thermal process.

After the thermal process 120 is performed, the fluorine dopant concentration in the polysilicon layer 104a may still present the Gaussian distributions. Since after the thermal process 120 is performed, the fluorine dopant is diffused into the dielectric layer 102a, oxide traps of the whole dielectric layer 102a may be filled by the fluorine dopant. Therefore, after the thermal process 120 is performed, the fluorine dopant concentration in the polysilicon layer 104a is decreased.

For example, referring to a relationship curve diagram of depth positions and fluorine dopant concentration of FIG. 1C, after the thermal process 120 is performed, the fluorine dopant concentration in the polysilicon layer 104a may still present the first Gaussian distribution G1, the second Gaussian distribution G2 and the third Gaussian distribution G3, where the first fluorine dopant peak concentration P1 of the first Gaussian distribution G1 is decreased to a first fluorine dopant peak concentration P1a, the second fluorine dopant peak concentration P2 of the second Gaussian distribution G2 is decreased to a second fluorine dopant peak concentration P2a, and the third fluorine dopant peak concentration P3 of the third Gaussian distribution G3 is decreased to a third fluorine dopant peak concentration P3a.

In the present embodiment, it is assumed that three ion implantation processes are performed, such that the fluorine dopant concentration may present three Gaussian distributions in the polysilicon layer 104a, though the invention not limited thereto. It is considered to be within a protection range as long as two or more ion implantation processes are performed to make the fluorine dopant concentration to present two or more Gaussian distributions in the polysilicon layer 104a.

Based on the above description, it is known that in the method for manufacturing the semiconductor structure, since the fluorine dopant concentration of the ion implantation process with the deeper implantation depth is smaller than the fluorine dopant concentration of the ion implantation process with the shallower implantation depth, a specific fluorine dopant concentration distribution is formed in the polysilicon layer 104a. In this way, after the thermal process is performed to the polysilicon layer 104a, since the fluorine dopant in the polysilicon layer 104a is diffused into the dielectric layer 102a, the oxide traps in the whole dielectric layer 102a can be filled by the fluorine dopant in the specific fluorine dopant concentration distribution, so as to mitigate the flicker noise of both of the high frequency portion and the low frequency portion.

The semiconductor structure of the aforementioned embodiment is described below with reference of FIG. 1B.

Referring to FIG. 1B, the semiconductor structure includes the substrate 100, the dielectric layer 102a and the polysilicon layer 104a. The dielectric layer 102a is disposed on the substrate 100. The polysilicon layer 104a is disposed on the dielectric layer 102a. A fluorine dopant concentration in the polysilicon layer 104a presents Gaussian distributions (for example, the third Gaussian distribution G3, the second Gaussian distribution G2 and the first Gaussian distribution G1) from the top portion to the bottom portion of the polysilicon layer 104a. Fluorine dopant peak concentrations (for example, the third fluorine dopant peak concentration P3, the second fluorine dopant peak concentration P2 and the first fluorine dopant peak concentration P1) of the Gaussian distributions are progressively decreased from the top portion to the bottom portion of the polysilicon layer 104a. Moreover, materials, configuration methods, forming methods and effects of various components of the semiconductor structure have been describe in detail in the aforementioned embodiment, and details thereof are not repeated.

Based on the aforementioned embodiment, it is known that in the semiconductor structure, since the fluorine dopant peak concentrations of the Gaussian distributions are progressively decreased from the top portion to the bottom portion of the polysilicon layer 104a, the specific fluorine dopant concentration distribution is formed in the polysilicon layer. In this way, after the thermal process is performed to the polysilicon layer 104a, since the fluorine dopant in the polysilicon layer 104a is diffused into the dielectric layer 102a, the oxide traps in the whole dielectric layer 102a may be filled by the fluorine dopant in the Gaussian distributions with different fluorine dopant peak concentrations, so as to mitigate the flicker noise of both of the high frequency portion and the low frequency portion.

In summary, in the semiconductor structure and the manufacturing method thereof of the invention, by adjusting the fluorine dopant concentration distribution in the polysilicon layer, the flicker noise of both of the high frequency portion and the low frequency portion is mitigated.

It will be apparent to those skilled in the art that various modifications and variations may be made to the structure of the invention without departing from the scope or spirit of the invention. In view of the foregoing, it is intended that the invention cover modifications and variations of this invention provided they fall within the scope of the following claims and their equivalents.

What is claimed is:
1. A semiconductor structure, comprising:
a substrate;
a dielectric layer, disposed on the substrate; and
a polysilicon layer, disposed on the dielectric layer,
wherein a fluorine dopant concentration in the polysilicon layer presents Gaussian distributions from a top portion to a bottom portion of the polysilicon layer,
fluorine dopant peak concentrations of the Gaussian distributions are progressively decreased from the top portion to the bottom portion of the polysilicon layer, and
the fluorine dopant peak concentrations are $8\times10^{15}$ ions/$cm^2$ to $1\times10^{16}$ ions/$cm^2$, $5\times10^{15}$ ions/$cm^2$ to $7\times10^{15}$ ions/$cm^2$, and $1\times10^{15}$ ions/$cm^2$ to $4\times10^{15}$ ions/$cm^2$ from the top portion to the bottom portion of the polysilicon layer,
wherein an uppermost part of the top portion of the polysilicon layer is at minimum in the fluorine dopant concentration.

2. The semiconductor structure as claimed in claim 1, wherein the substrate comprises a silicon substrate.

3. The semiconductor structure as claimed in claim 1, wherein a material of the dielectric layer comprises silicon oxide.

4. The semiconductor structure as claimed in claim 1, wherein a material of the polysilicon layer comprises doped polysilicon or undoped polysilicon.

5. The semiconductor structure as claimed in claim 1, wherein the fluorine dopant peak concentrations comprise:
a first fluorine dopant peak concentration, close to the bottom portion of the polysilicon layer; and
a second fluorine dopant peak concentration, close to the top portion of the polysilicon layer.

6. The semiconductor structure as claimed in claim 5, wherein the fluorine dopant peak concentrations further comprise:
a third fluorine dopant peak concentration, wherein compared to the second fluorine dopant peak concentration, the third fluorine dopant peak concentration is closer to the top portion of the polysilicon layer.

* * * * *